(12) United States Patent
Gu

(10) Patent No.: US 11,646,727 B2
(45) Date of Patent: May 9, 2023

(54) COMPARATOR AND DECISION FEEDBACK EQUALIZATION CIRCUIT

(71) Applicant: CHANGXIN MEMORY TECHNOLOGIES, INC., Hefei (CN)

(72) Inventor: Yinchuan Gu, Hefei (CN)

(73) Assignee: CHANGXIN MEMORY TECHNOLOGIES, INC., Hefei (CN)

( * ) Notice: Subject to any disclaimer, the term of this patent is extended or adjusted under 35 U.S.C. 154(b) by 0 days.

(21) Appl. No.: 17/664,477

(22) Filed: May 23, 2022

(65) Prior Publication Data

US 2023/0074935 A1 Mar. 9, 2023

Related U.S. Application Data

(63) Continuation of application No. PCT/CN2022/071031, filed on Jan. 10, 2022.

(30) Foreign Application Priority Data

Sep. 3, 2021 (CN) .......................... 202111030206.5

(51) Int. Cl.
*H03K 5/22* (2006.01)
*H03K 19/17784* (2020.01)
(Continued)

(52) U.S. Cl.
CPC ................ *H03K 5/22* (2013.01); *H03K 5/086* (2013.01); *H03K 5/135* (2013.01); *H03K 19/17784* (2013.01)

(58) Field of Classification Search
CPC ........... H03K 5/22; H03K 5/086; H03K 5/135
(Continued)

(56) References Cited

U.S. PATENT DOCUMENTS

| 4,574,206 A | 3/1986 | Todokoro et al. |
| 6,377,108 B1 | 4/2002 | Kennedy et al. |

(Continued)

FOREIGN PATENT DOCUMENTS

| CN | 102045044 A | 5/2011 |
| CN | 105680834 A | 6/2016 |

(Continued)

OTHER PUBLICATIONS

International Search Report cited in PCT/CN2022/076276 dated Jun. 8, 2022, 11 pages.

(Continued)

*Primary Examiner* — Tomi Skibinski
(74) *Attorney, Agent, or Firm* — Cooper Legal Group, LLC

(57) ABSTRACT

The present disclosure provides a comparator and a decision feedback equalization circuit. The comparator includes: a first sampling circuit configured to generate, under the control of a first control signal and a clock signal, first differential signals according to a signal to be compared and a first reference signal; a first positive feedback circuit configured to accelerate a difference between the first differential signals; a second sampling circuit configured to generate, under the control of a second control signal and the clock signal, second differential signals according to the signal to be compared and a second reference signal, where the first reference signal is larger than the second reference signal; a second positive feedback circuit configured to accelerate a difference between the second differential signals.

19 Claims, 4 Drawing Sheets

(51) Int. Cl.
*H03K 5/08* (2006.01)
*H03K 5/135* (2006.01)

(58) Field of Classification Search
USPC .......................................................... 327/77
See application file for complete search history.

(56) References Cited

U.S. PATENT DOCUMENTS 8,446,178 B2 * 5/2013 Pang ................... H03F 3/45183
327/66
2019/0312757 A1 10/2019 Sakai

FOREIGN PATENT DOCUMENTS

| | | |
|---|---|---|
| CN | 205725686 U | 11/2016 |
| CN | 107565966 A | 1/2018 |
| CN | 112737586 A | 4/2021 |
| CN | 113129987 A | 7/2021 |
| CN | 113300987 A | 8/2021 |
| CN | 113556104 A | 10/2021 |

OTHER PUBLICATIONS

International Search Report cited in PCT/CN2022/071031 dated May 19, 2022, 11 pages.

* cited by examiner

COMPARATOR AND DECISION FEEDBACK EQUALIZATION CIRCUIT

CROSS-REFERENCE TO RELATED APPLICATIONS

This is a continuation of International Application No. PCT/CN2022/071031, filed on Jan. 10, 2022, which claims the priority to Chinese Patent Application No. 202111030206.5, titled "COMPARATOR AND DECISION FEEDBACK EQUALIZATION CIRCUIT" and filed with China National Intellectual Property Administration (CNIPA) on Sep. 3, 2021. The entire contents of International Application No. PCT/CN2022/071031 and Chinese Patent Application No. 202111030206.5 are incorporated herein by reference.

TECHNICAL FIELD

The present disclosure relates to, but is not limited to, a comparator and a decision feedback equalization circuit.

BACKGROUND

Nowadays, people show increasing demand for mobile devices such as mobile phones, tablet computers, and various wearable accessories because these mobile devices greatly enrich our daily life and work.

However, due to a limited battery life, higher requirements are placed on power consumption of all components in the mobile device. As an indispensable component in the mobile device, dynamic random access memory (DRAM) is also required to work with a lower operating voltage and lower energy consumption. A comparator is an important device for implementing DRAM data reading and writing; however, existing comparators cannot meet the requirements for lower operating voltage and energy consumption.

SUMMARY

One embodiment of the present disclosure provides a comparator, including:

a first sampling circuit provided with an output terminal, and configured to generate, under the control of a first control signal and a clock signal, first differential signals according to a signal to be compared and a first reference signal;

a first positive feedback circuit connected to the output terminal of the first sampling circuit, and configured to accelerate a difference between the first differential signals;

a second sampling circuit provided with an output terminal connected to the output terminal of the first sampling circuit, and configured to generate, under the control of a second control signal and the clock signal, second differential signals according to the signal to be compared and a second reference signal, where the first reference signal is larger than the second reference signal;

a second positive feedback circuit connected to the output terminal of the second sampling circuit, and configured to accelerate a difference between the second differential signals; and an output circuit provided with an input terminal connected to the output terminal of the first sampling circuit, and configured to amplify and latch a voltage signal of the output terminal of the first sampling circuit or a voltage signal of the output terminal of the second sampling circuit and output a comparison result.

Another embodiment of the present disclosure provides a decision feedback equalization circuit, including comparators in the foregoing embodiment, which are sequentially marked as a first comparator, a second comparator, a third comparator, and a fourth comparator;

the first comparator is provided with a first input terminal for receiving a signal to be compared, a second input terminal for receiving a first reference signal, a third input terminal for receiving a second reference signal, a fourth input terminal and a fifth input terminal that are connected to an output terminal of the fourth comparator for receiving a first control signal and a second control signal, and a sixth input terminal for receiving a first clock signal;

the second comparator is provided with a first input terminal for receiving the signal to be compared, a second input terminal for receiving the first reference signal, a third input terminal for receiving the second reference signal, a fourth input terminal and a fifth input terminal that are connected to an output terminal of the first comparator for receiving the first control signal and the second control signal, and a sixth input terminal for receiving a second clock signal;

the third comparator is provided with a first input terminal for receiving the signal to be compared, a second input terminal for receiving the first reference signal, a third input terminal for receiving the second reference signal, a fourth input terminal and a fifth input terminal that are connected to an output terminal of the second comparator for receiving the first control signal and the second control signal, and a sixth input terminal for receiving a third clock signal; and the fourth comparator is provided with a first input terminal for receiving the signal to be compared, a second input terminal for receiving the first reference signal, a third input terminal for receiving the second reference signal, a fourth input terminal and a fifth input terminal that are connected to an output terminal of the third comparator for receiving the first control signal and the second control signal, and a sixth input terminal for receiving a fourth clock signal.

DETAILED DESCRIPTION

Exemplary embodiments are described in detail herein, and examples thereof are represented in the accompanying drawings. When the following descriptions relate to the accompanying drawings, unless otherwise stated, same digitals in different accompanying drawings represent same or similar essential factors. Embodiments described in the following exemplary embodiments do not represent all embodiments consistent with the present disclosure. On the contrary, the embodiments are merely examples of apparatuses and methods that are described in detail in the appended claims and consistent with some aspects of the present disclosure.

Figure 1:
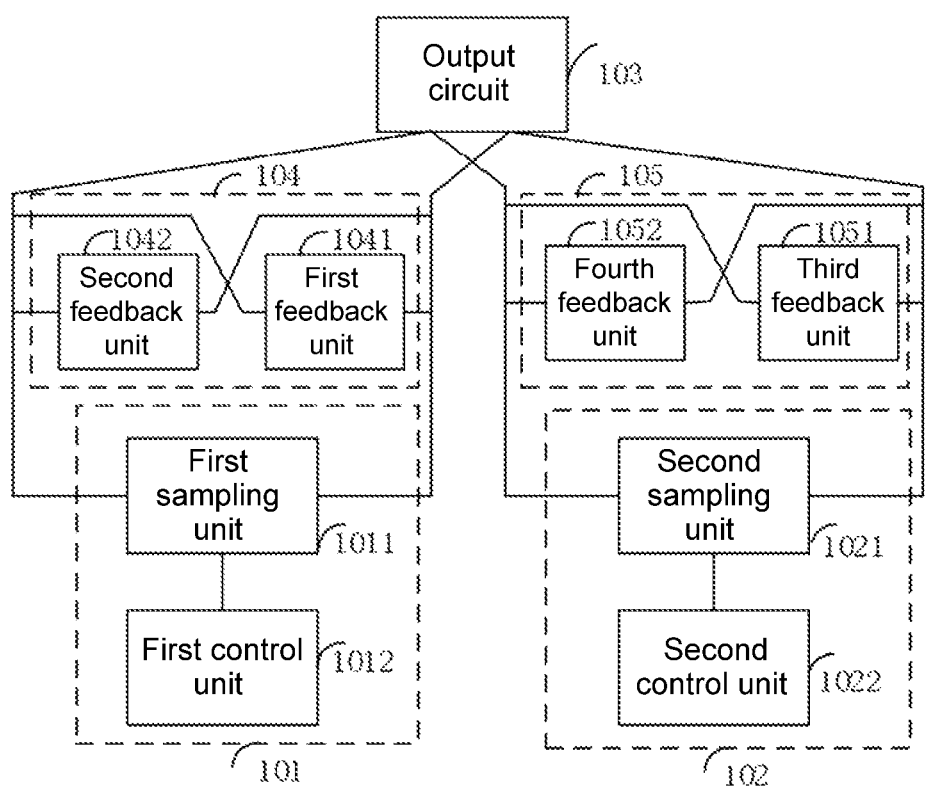
FIG. 1 is a structural block diagram of a comparator according to one embodiment of the present disclosure.

As shown in FIG. 1, one embodiment of the present disclosure provides a comparator, including a first sampling circuit 101, a second sampling circuit 102, and an output circuit 103.

Each of the first sampling circuit 101, the second sampling circuit 102, and the output circuit 103 is provided with an input terminal and an output terminal, and each of the first sampling circuit 101 and the second sampling circuit 102 is also provided with a control terminal. The first sampling circuit 101 is provided with the control terminal for receiving a first control signal and a clock signal and the input terminal for receiving a signal to be compared and a first reference signal, so that the first sampling circuit 101 generates, under the control of the first control signal and the clock signal, first differential signals according to the signal to be compared and the first reference signal.

The second sampling circuit 102 is provided with the control terminal for receiving a second control signal and the clock signal and the input terminal for receiving the signal to be compared and a second reference signal, so that the second sampling circuit 102 generates, under the control of the second control signal and the clock signal, second differential signals according to the signal to be compared and the second reference signal.

Both the output terminal of the second sampling circuit 102 and the input terminal of the output circuit 103 are connected to the output terminal of the first sampling circuit 101, so that the output circuit 103 amplifies and latches a voltage signal of the output terminal of the first sampling circuit 101 or a voltage signal of the output terminal of the second sampling circuit 102 and outputs a comparison result.

The first reference signal is larger than the second reference signal. When the signal to be compared is influenced and a voltage value thereof becomes larger, the first control signal controls the first sampling circuit 101 to sample the signal to be compared and the first reference signal to generate the first differential signals, and the second control signal controls the second sampling circuit 102 to stop sampling. When the signal to be compared is influenced and the voltage value thereof becomes smaller, the first control signal controls the first sampling circuit 101 to stop sampling, and the second control signal controls the second sampling circuit 102 to sample the signal to be compared and the second reference signal to generate the second differential signals. By setting in this way, when the signal to be compared is influenced and the voltage value thereof becomes smaller, the second reference signal having a relatively small voltage value is used, and when the signal to be compared is influenced and the voltage value thereof becomes larger, the first reference signal having a relatively large voltage value is used. This ensures that a polarity of a differential signal generated before the signal to be compared is influenced is the same as that of a differential signal generated after the signal to be compared is influenced, so that the output circuit 103 can output a more accurate comparison result.

If the first reference signal is not properly selected, a response time of the first sampling circuit 101 becomes longer, that is, the first sampling circuit 101 needs a longer time to present the first differential signals having a relatively large difference at the output terminal. A first positive feedback circuit 104 accelerates a difference between the first differential signals through a positive feedback mechanism, thereby shortening the time during which the first sampling circuit 101 presents the first differential signals having a relatively large difference at the output terminal, i.e., shortening a time during which the comparator is in a sampling phase, thereby increasing a response rate of the comparator and reducing power consumption of the comparator.

Similarly, if the second reference signal is not properly selected, a response time of the second sampling circuit 102 becomes longer, that is, the second sampling circuit 102 needs a longer time to present the second differential signals having a relatively large difference at the output terminal. A second positive feedback circuit 105 accelerates a difference between the second differential signals through the positive feedback mechanism, thereby shortening the time during which the second sampling circuit 102 presents the second differential signals having a relatively large difference at the output terminal, i.e., shortening the time during which the comparator is in the sampling phase, thereby increasing the response rate of the comparator and reducing the power consumption of the comparator.

In one embodiment, the first sampling circuit 101 includes a first sampling unit 1011 and a first control unit 1012, each of the first sampling unit 1011 and the first control unit 1012 is provided with an input terminal and an output terminal, and the first sampling unit 1011 is also provided with a control terminal. The input terminal of the first control unit 1012 is configured to receive the first control signal and the clock signal, so as to control an operating mode of the first sampling unit 1011 according to the first control signal and the clock signal, where the operating mode of the first sampling unit 1011 includes a sampling mode. The output terminal of the first control unit 1012 is connected to the control terminal of the first sampling unit 1011, and the first sampling unit 1011 is configured to generate, when operating in the sampling mode, the first differential signals according to the signal to be compared and the first reference signal.

In one embodiment, the second sampling circuit 102 includes a second sampling unit 1021 and a second control unit 1022, each of the second sampling unit 1021 and the second control unit 1022 is provided with an input terminal and an output terminal, and the second sampling unit 1021 is also provided with a control terminal. The input terminal of the second control unit 1022 is configured to receive the second control signal and the clock signal, so as to control an operating mode of the second sampling unit 1021 according to the second control signal and the clock signal, where the operating mode of the second sampling unit 1021 includes the sampling mode. The output terminal of the second control unit 1022 is connected to the control terminal of the second sampling unit 1021, and the second sampling unit 1021 is configured to generate, when operating in the sampling mode, the second differential signals according to the signal to be compared and the second reference signal.

In one embodiment, the first positive feedback circuit 104 includes a first feedback unit 1041 and a second feedback unit 1042, each of which is provided with a control terminal and a first terminal.

The first feedback unit 1041 is provided with the control terminal connected to a first output terminal of the first sampling circuit 101 and the first terminal connected to a second output terminal of the first sampling circuit 101. The second feedback unit 1042 is provided with the control terminal connected to the second output terminal of the first sampling circuit 101 and the first terminal connected to the first output terminal of the first sampling circuit 101.

The first feedback unit 1041 is configured to pull a voltage of the second output terminal of the first sampling circuit 101 according to a voltage of the first output terminal of the first sampling circuit 101, and the second feedback unit 1042 is configured to pull the voltage of the first output terminal of the first sampling circuit 101 according to the voltage of the second output terminal of the first sampling circuit 101.

A direction of the first feedback unit 1041 pulling the voltage of the second output terminal of the first sampling circuit 101 is the same as that of the second feedback unit 1042 pulling the voltage of the first output terminal of the first sampling circuit 101. When the first feedback unit 1041 pulls up the voltage of the second output terminal of the first sampling circuit 101, the second feedback unit 1042 also pulls up the voltage of the first output terminal of the first sampling circuit 101. When the first feedback unit 1041 pulls down the voltage of the second output terminal of the first sampling circuit 101, the second feedback unit 1042 also pulls down the voltage of the first output terminal of the first sampling circuit 101.

In one embodiment, the second positive feedback circuit 105 includes a third feedback unit 1051 and a fourth feedback unit 1052, each of which is provided with a control terminal and a first terminal.

The third feedback unit 1051 is provided with the control terminal connected to a first output terminal of the second sampling circuit 102 and the first terminal connected to a second output terminal of the second sampling circuit 102. The fourth feedback unit 1052 is provided with the control terminal connected to the second output terminal of the second sampling circuit 102 and the first terminal connected to the first output terminal of the second sampling circuit 102.

The third feedback unit 1051 is configured to pull a voltage of the second output terminal of the second sampling circuit 102 according to a voltage of the first output terminal of the second sampling circuit 102, and the fourth feedback unit 1052 is configured to pull the voltage of the first output terminal of the second sampling circuit 102 according to the voltage of the second output terminal of the second sampling circuit 102.

A direction of the third feedback unit 1051 pulling the voltage of the second output terminal of the second sampling circuit 102 is the same as that of the fourth feedback unit 1052 pulling the voltage of the first output terminal of the second sampling circuit 102. When the third feedback unit 1051 pulls up the voltage of the second output terminal of the second sampling circuit 102, the fourth feedback unit 1052 also pulls up the voltage of the first output terminal of the second sampling circuit 102. When the third feedback unit 1051 pulls down the voltage of the second output terminal of the second sampling circuit 102, the fourth feedback unit 1052 also pulls down the voltage of the first output terminal of the second sampling circuit 102.

The following is an example of pulling down the voltages of the two output terminals of the first sampling circuit 101: when the voltage of the first output terminal of the first sampling circuit 101 is higher than that of the second output terminal of the first sampling circuit 101, a capability of the first feedback unit 1041 pulling down the voltage of the second output terminal of the first sampling circuit 101 is relatively strong, and a capability of the second feedback unit 1042 pulling down the voltage of the first output terminal of the first sampling circuit 101 is relatively weak, that is, a drop rate of the voltage of the first output terminal is lower than that of the voltage of the second output terminal, so that a difference between the voltage of the first output terminal and the voltage of the second output terminal becomes larger and larger, so as to implement forward feedback.

When the voltage of the first output terminal of the first sampling circuit 101 is lower than that of the second output terminal of the first sampling circuit 101, the capability of the first feedback unit 1041 pulling down the voltage of the second output terminal of the first sampling circuit 101 is relatively weak, and the capability of the second feedback unit 1042 pulling down the voltage of the first output terminal of the first sampling circuit 101 is relatively strong, that is, the drop rate of the voltage of the first output terminal is higher than that of the voltage of the second output terminal, so that the difference between the voltage of the first output terminal and the voltage of the second output terminal becomes larger and larger, so as to implement the forward feedback.

The following is an example of pulling up the voltages of the two output terminals of the first sampling circuit 101: when the voltage of the first output terminal of the first sampling circuit 101 is higher than that of the second output terminal of the first sampling circuit 101, a capability of the first feedback unit 1041 pulling up the voltage of the second output terminal of the first sampling circuit 101 is relatively weak, and a capability of the second feedback unit 1042 pulling up the voltage of the first output terminal of the first sampling circuit 101 is relatively strong, that is, a rise rate of the voltage of the first output terminal is higher than that of the voltage of the second output terminal, so that the difference between the voltage of the first output terminal and the voltage of the second output terminal becomes larger and larger, so as to implement the forward feedback.

When the voltage of the first output terminal of the first sampling circuit 101 is lower than that of the second output terminal of the first sampling circuit 101, the capability of the first feedback unit 1041 pulling up the voltage of the second output terminal of the first sampling circuit 101 is relatively strong, and the capability of the second feedback unit 1042 pulling up the voltage of the first output terminal of the first sampling circuit 101 is relatively weak, that is, the rise rate of the voltage of the first output terminal is lower than that of the voltage of the second output terminal, so that the difference between the voltage of the first output terminal and the voltage of the second output terminal becomes larger and larger, so as to implement the forward feedback.

In the foregoing technical solution, if either one or both of the first reference signal and the second reference signal are improperly selected, generating differential signals having a relatively large difference in a corresponding input circuit requires a longer time, and after there is a slight difference between two output terminals of the corresponding input circuit, the positive feedback circuit in the input circuit accelerates the difference through the positive feedback mechanism, thereby shortening the time of the sampling phase, increasing the response rate of the comparator, and reducing the power consumption of the comparator.

In the foregoing technical solution, the comparator includes the first sampling circuit 101, the second sampling circuit 102, and the output circuit 103. The first sampling circuit 101 is configured to generate the first differential signals according to the signal to be compared and the first reference signal. The second sampling circuit 102 is configured to generate the second differential signals according to the signal to be compared and the second reference signal. The first sampling circuit 101 or the second sampling circuit 102 is controlled to perform sampling according to the influence of the signal to be compared. This ensures that a polarity of a differential signal generated before the signal to be compared is influenced is the same as that of a differential signal generated after the signal to be compared is influenced, so that the output circuit 103 can output a more accurate comparison result, thereby eliminating intersymbol interference.

Figure 2:
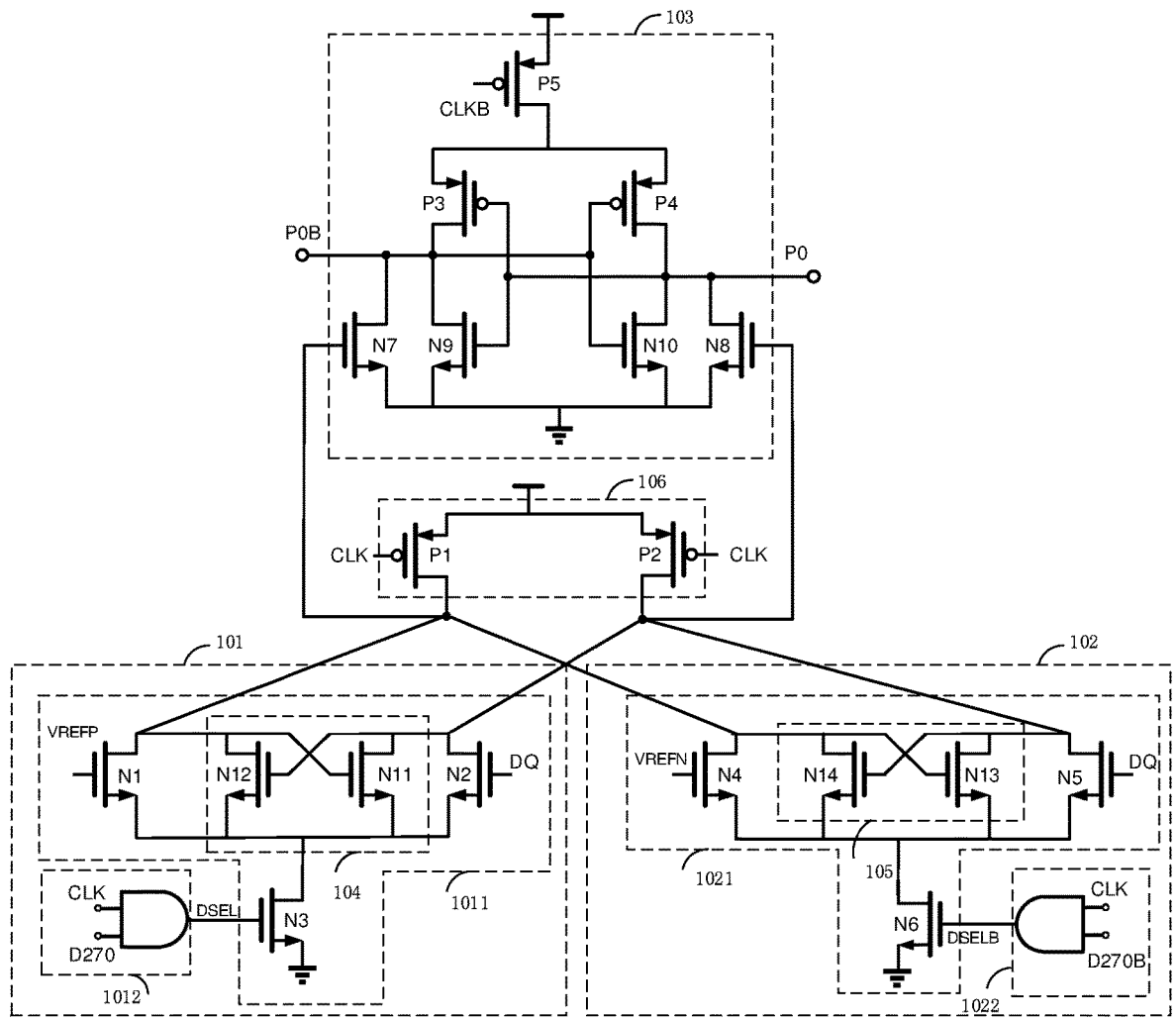
FIG. 2 is a specific circuit diagram of a comparator according to one embodiment of the present disclosure.

As shown in FIG. 2, one embodiment of the present disclosure provides a comparator, including six input terminals and two output terminals. The comparator includes a first sampling circuit 101, a second sampling circuit 102, and an output circuit 103. The first sampling circuit 101 is also provided with a first sampling unit 1011 and a first control unit 1012, and the second sampling circuit 102 is also provided with a second sampling unit 1021 and a second control unit 1022.

The first sampling unit 1011 also includes a first input terminal and a second input terminal, and a first output terminal and a second output terminal. The second sampling unit 1021 also includes a first input terminal and a second input terminal, and a first output terminal and a second output terminal. The first control unit 1012 also includes a first input terminal and a second input terminal. The second control unit 1022 also includes a first input terminal and a second input terminal.

The first input terminal of the first sampling unit 1011 is taken as a first input terminal of the comparator for a first reference signal VREFP. Both the second input terminal of the second sampling unit 1021 and the second input terminal of the first sampling unit 1011 are taken as a second input terminal of the comparator for receiving a signal to be compared DQ. The first input terminal of the second sampling unit 1021 is taken as a third input terminal of the comparator for a second reference signal VREFN. The first input terminal of the first control unit 1012 is taken as a fourth input terminal of the comparator for receiving a first control signal D270. The first input terminal of the second control unit 1022 is taken as a fifth input terminal of the comparator for receiving a second control signal D270B. Both the second input terminal of the first control unit 1012 and the second input terminal of the second control unit 1022 are taken as a sixth input terminal of the comparator for receiving a clock signal CLK.

The output circuit 103 also includes a first output terminal as a first output terminal of the comparator and a second output terminal as a second output terminal of the comparator.

The first sampling unit 1011 includes a first input transistor N1, a second input transistor N2, and a third input transistor N3. The first input transistor N1 is provided with a control terminal as the first input terminal of the first sampling unit 1011 for receiving the first reference signal VREFP and a first terminal as the first output terminal of the first sampling unit 1011. The second input transistor N2 is provided with a control terminal as the second input terminal of the first sampling unit 1011 for receiving the signal to be compared DQ and a first terminal as the second output terminal of the first sampling unit 1011. The third input transistor N3 is provided with a control terminal, as a control terminal of the first sampling unit 1011, connected to an output terminal of the first control unit 1012. The third input transistor N3 is provided with a first terminal connected to a second terminal of the first input transistor N1 and a second terminal of the second input transistor N2, and a second terminal connected to a ground terminal.

In the foregoing technical solution, the first sampling unit 1011 includes three transistors, two transistors are configured to receive the first reference signal VREFP and the signal to be compared DQ, and the control terminal of the other one transistor is taken as a sampling unit, so that the first control unit 1012 controls an operating mode of the first sampling unit 1011 through the control terminal of the transistor of the first sampling unit 1011. The first control unit 1012 can control the operating mode of the first sampling unit 1011 according to the influence of the signal to be compared DQ. This ensures that a polarity of a differential signal generated before the signal to be compared DQ is influenced is the same as that of a differential signal generated after the signal to be compared DQ is influenced, so that the output circuit 103 can output a more accurate comparison result.

The first control unit 1012 includes a first AND gate circuit provided with a first input terminal, a second input terminal, and an output terminal. The first AND gate circuit is provided with the first input terminal as the first input terminal of the first control unit 1012 for receiving the first control signal D270, the second input terminal as the second input terminal of the first control unit 1012 for receiving the clock signal CLK, and the output terminal, as the output terminal of the first control unit 1012, connected to the control terminal of the first sampling unit 1011.

In the foregoing technical solution, the first control unit 1012 includes the first AND gate circuit, outputs a calculation result DSEL after the first AND gate circuit performs AND calculation on the first control signal D270 and the clock signal CLK, and employs the calculation result DSEL to control the operating mode of the first sampling unit 1011, thereby controlling the operating mode of the first sampling unit 1011 according to the first control signal D270 and the clock signal CLK.

The second sampling unit 1021 includes a fourth input transistor N4, a fifth input transistor N5, and a sixth input transistor N6. The fourth input transistor N4 is provided with a control terminal as the first input terminal of the second sampling unit 1021 for receiving the second reference signal VREFN and a first terminal as the first output terminal of the second sampling unit 1021. The fifth input transistor N5 is provided with a control terminal as the second input terminal of the second sampling unit 1021 for receiving the signal to be compared DQ and a first terminal as the second output terminal of the second sampling unit 1021. The sixth input transistor N6 is provided with a control terminal, as a control terminal of the second sampling unit 1021, connected to an output terminal of the second control unit 1022. The sixth input transistor N6 is provided with a first terminal connected to a second terminal of the fourth input transistor N4 and a second terminal of the fifth input transistor N5, and a second terminal connected to the ground terminal.

The second control unit 1022 includes a second AND gate circuit provided with a first input terminal, a second input terminal, and an output terminal. The second AND gate circuit is provided with the first input terminal as the first input terminal of the second control unit 1022 for receiving the second control signal D270B, the second input terminal as the second input terminal of the second control unit 1022 for receiving the clock signal CLK, and the output terminal, as the output terminal of the second control unit 1022, connected to the control terminal of the second sampling unit 1021.

In the foregoing technical solution, the second control unit 1022 includes the second AND gate circuit, outputs a calculation result DSELB after the second AND gate circuit performs the AND calculation on the second control signal D270B and the clock signal CLK, and employs the calculation result DSELB to control the operating mode of the second sampling unit 1021, thereby controlling the operating mode of the second sampling unit 1021 according to the second control signal D270B and the clock signal CLK.

The first control signal D270 and the second control signal D270B are a pair of inversion signals. That is, when the first control signal D270 is at a high level, the second control signal D270B is at a low level; and when the first control signal D270 is at a low level, the second control signal D270B is at a high level, thereby controlling the first sampling unit 1011 or the second sampling unit 1021 to operate in a sampling mode.

In one embodiment, the first input transistor N1 to the sixth input transistor N6 are of a same type. If the first input transistor N1 to the sixth input transistor N6 are all N-type transistors, the N-type transistors are provided with drains as the first terminals and gates as the control terminals.

When the signal to be compared DQ is influenced and a voltage value thereof becomes larger, the first control signal is at a high level, and the second control signal is at a low level. When the clock signal CLK arrives, the first AND gate circuit outputs the high level, the second AND gate circuit outputs the low level, the third input transistor N3 is turned on, and the sixth input transistor N6 is turned off. The first sampling unit 1011 operates in the sampling mode, and the second sampling unit 1021 operates in an idle mode, i.e., stopping sampling. When the first sampling unit 1011 operates in the sampling mode, the first reference signal VREFP pulls a drain voltage of the first input transistor N1, and the signal to be compared DQ pulls a drain voltage of the second input transistor N2. When the first reference signal VREFP and the signal to be compared DQ have different voltage values, there are also different pulling capabilities to the transistors, and first differential signals are generated at the drain of the first input transistor N1 and the drain of the second input transistor N2. For example, since when the signal to be compared DQ is influenced and the voltage value thereof becomes larger, the first reference signal VREFP having a relatively large voltage value is selected, it can still be ensured that when the first reference signal VREFP is larger than the signal to be compared DQ, the drain voltage of the first input transistor N1 is larger than the drain voltage of the second input transistor N2. This ensures that a polarity of a differential signal generated before the signal to be compared DQ is influenced is the same as that of a differential signal generated after the signal to be compared DQ is influenced.

When the signal to be compared DQ is influenced and the voltage value thereof becomes smaller, the first control signal is at a low level, and the second control signal is at a high level. When the clock signal CLK arrives, the first AND gate circuit outputs the low level, the second AND gate circuit outputs the high level, the third input transistor N3 is turned off, and the sixth input transistor N6 is turned on. The first sampling unit 1011 operates in the idle mode, and the second sampling unit 1021 operates in the sampling mode. When the second sampling unit 1021 operates in the sampling mode, the second reference signal VREFN pulls a drain voltage of the fourth input transistor N4, and the signal to be compared DQ pulls a drain voltage of the fifth input transistor N5. When the second reference signal VREFN and the signal to be compared DQ have different voltage values, there are also different pulling capabilities to the transistors, and second differential signals are generated at the drain of the fourth input transistor N4 and the drain of the fifth input transistor N5. For example, since when the signal to be compared DQ is influenced and the voltage value thereof becomes smaller, the second reference signal VREFN having a relatively small voltage value is selected, it can still be ensured that when the second reference signal VREFN is smaller than the signal to be compared DQ, the drain voltage of the fourth input transistor N4 is smaller than the drain voltage of the fifth input transistor N5. This ensures that the polarity of the differential signal generated before the signal to be compared DQ is influenced is the same as that of the differential signal generated after the signal to be compared DQ is influenced.

In one embodiment, the first control signal and the second control signal are determined according to the influence tendency of the signal to be compared DQ. If the influence tendency of the signal to be compared DQ is increasing, the first control signal is at a high level, and the second control signal is at a low level; and if the influence tendency of the signal to be compared DQ is decreasing, the first control signal is at a low level, and the second control signal is at a high level.

In one embodiment, the first feedback unit 1041 includes a first feedback transistor N11 provided with a control terminal connected to the first terminal of the first input transistor N1, a first terminal connected to the first terminal of the second input transistor N2, and a second terminal connected to the second terminal of the second input transistor N2.

The second feedback unit 1042 includes a second feedback transistor N12 provided with a control terminal connected to the first terminal of the second input transistor N2, a first terminal connected to the first terminal of the first input transistor N1, and a second terminal connected to the second terminal of the first input transistor N1.

In one embodiment, the first feedback transistor N11, the second feedback transistor N12, the first input transistor N1 and the second input transistor N2 are of a same type, thereby ensuring that a direction of the first feedback transistor N11 pulling the voltage of the second output terminal of the first sampling circuit 101 is the same as that of the second feedback transistor N12 pulling the voltage of the first output terminal of the first sampling circuit 101, and also ensuring that a direction of a feedback transistor pulling a voltage of an output terminal of the first sampling circuit 101 is the same as that of an input transistor pulling the voltage of the output terminal of the first sampling circuit 101, so as to achieve the positive feedback.

When the voltage of the first terminal of the first input transistor N1 is larger, a capability of the first feedback transistor N11 pulling down the voltage of the first terminal of the second input transistor N2 is greater, and the voltage of the first terminal of the second input transistor N2 drops faster, thereby implementing the positive feedback mechanism, and accelerating a difference between differential voltages of the first input transistor N1 and the second input transistor N2.

In one embodiment, the third feedback unit 1051 includes a third feedback transistor N13 provided with a control terminal connected to the first terminal of the fourth input transistor N4, a first terminal connected to the first terminal of the fifth input transistor N5, and a second terminal connected to the second terminal of the fifth input transistor N5.

The fourth feedback unit 1052 includes a fourth feedback transistor N14 provided with a control terminal connected to the first terminal of the fifth input transistor N5, a first terminal connected to the first terminal of the fourth input transistor N4, and a second terminal connected to the second terminal of the fourth input transistor N4.

In one embodiment, the third feedback transistor N13, the fourth feedback transistor N14, the fourth input transistor N4, and the fifth input transistor N5 are of a same type, thereby ensuring that a direction of the third feedback transistor N13 pulling the voltage of the second output terminal of the second sampling circuit 102 is the same as that of the fourth feedback transistor N14 pulling the voltage of the first output terminal of the second sampling circuit 102, and also ensuring that a direction of the feedback transistor pulling a voltage of an output terminal of the second sampling circuit 102 is the same as that of the input transistor pulling the voltage of the output terminal of the second sampling circuit 102, so as to achieve the positive feedback.

When the voltage of the first terminal of the fourth input transistor N4 is larger, a capability of the third feedback transistor N13 pulling down the voltage of the first terminal of the fifth input transistor N5 is greater, and the voltage of the first terminal of the fifth input transistor N5 drops faster, thereby implementing the positive feedback mechanism, and accelerating a difference between differential voltages of the fourth input transistor N4 and the fifth input transistor N5.

In one embodiment, the first feedback transistor N11 to the fourth feedback transistor N14, and the first input transistor N1 to the sixth input transistor N6 are of a same type. If the first feedback transistor N11 to the fourth feedback transistor N14, and the first input transistor N1 to the sixth input transistor N6 are all N-type transistors, the N-type transistors are provided with drains as the first terminals and gates as the control terminals.

The output circuit 103 includes a first output transistor N7, a second output transistor N8, a third output transistor N9, a fourth output transistor N10, a fifth output transistor P3, a sixth output transistor P4, and a seventh output transistor P5. The output circuit 103 includes a first input terminal and a second input terminal, and a first output terminal and a second output terminal.

The first output transistor N7 is provided with a control terminal, as the first input terminal of the output circuit 103, connected to the first output terminal of the first sampling unit 1011, a first terminal as the first output terminal of the output circuit 103, and a second terminal connected to the ground terminal. The second output transistor N8 is provided with a control terminal, as the second input terminal of the output circuit 103, connected to the second output terminal of the first sampling unit 1011, a first terminal as the second output terminal of the output circuit 103, and a second terminal connected to the ground terminal.

The third output transistor N9 is provided with a first terminal connected to the first terminal of the first output transistor N7, a second terminal connected to the second terminal of the first output transistor N7, and a control terminal connected to a first terminal of the fourth output transistor N10. The fourth output transistor N10 is provided with the first terminal connected to the first terminal of the second output transistor N8, a second terminal connected to the second terminal of the second output transistor N8, and a control terminal connected to the first terminal of the third output transistor N9. The fifth output transistor P3 is provided with a second terminal connected to the first terminal of the third output transistor N9, and a control terminal connected to the first terminal of the fourth output transistor N10. The sixth output transistor P4 is provided with a second terminal connected to the first terminal of the fourth output transistor N10, and a control terminal connected to the first terminal of the third output transistor N9.

The seventh output transistor P5 is provided with a control terminal for receiving the clock signal CLK, a first terminal connected to a power terminal, and a second terminal connected to the first terminal of the fifth output transistor P3 and the first terminal of the sixth output transistor P4.

In one embodiment, the first output transistor N7 to the fourth output transistor N10 are all N-type transistors, and the fifth output transistor P3 to the seventh output transistor P5 are all P-type transistors. The N-type transistors are provided with drains as the first terminals and gates as the control terminals, and the P-type transistors are provided with sources as the first terminals and gates as the control terminals.

When a pulse in the clock signal CLK arrives, the inverted clock signal CLKB is inputted to the seventh output transistor P5, so that the seventh output transistor P5 is turned on, and the output circuit 103 amplifies and latches a voltage signal at the output terminal of the first sampling circuit 101 or a voltage signal at the output terminal of the second sampling circuit 102 and outputs a comparison result. Taking the first sampling circuit 101 sampling and the second sampling circuit 102 stopping sampling as an example, the control terminal of the first output transistor N7 receives one of the first differential signals, and the control terminal of the second output transistor N8 receives the other one of the first differential signals. The two differential signals are amplified by the first output transistor N7 and the second output transistor N8, then are inputted to the control terminals of the third output transistor N9 to the sixth output transistor P4, and are amplified and latched again by the third output transistor N9 to the sixth output transistor P4. After that, the comparison result is outputted.

After the drain voltage of the first output transistor N7 and the drain voltage of the second output transistor N8 are amplified and latched again by the third output transistor N9 to the sixth output transistor P4, there are two cases for the drain voltage of the first output transistor N7 and the drain voltage of the second output transistor N8. In the first case, the drain voltage POB of the first output transistor N7 is at a high level, the drain voltage P0 of the second output transistor N8 is at a low level, and number "0" indicates an output result. In the second case, the drain voltage POB of the first output transistor N7 is at a low level, the drain voltage P0 of the second output transistor N8 is at a high level, and number "1" indicates the output result.

In the foregoing technical solution, the first differential signals or the second differential signals are amplified by two transistors and then amplified and latched by four transistors, so that the accuracy of the output result can be further improved.

In one embodiment, the comparator further includes a reset circuit 106. The reset circuit 106 is connected to the first sampling circuit 101 and the second sampling circuit 102, and is configured to reset the voltage of the first sampling circuit 101 before the first sampling circuit 101 enters the sampling mode and reset the voltage of the second sampling circuit 102 before the second sampling circuit 102 enters the sampling mode.

In the foregoing technical solution, the reset circuit 106 resets the voltage at the output terminal of the first sampling circuit 101 and the voltage at the output terminal of the second sampling circuit 102, so that the voltages at the output terminals of the two sampling units can be quickly reset to increase a reaction rate of the comparator.

In one embodiment, the reset circuit 106 includes a first clock-controlled transistor P1 and a second clock-controlled transistor P2. The first clock-controlled transistor P1 is provided with a control terminal for receiving the clock signal CLK, a first terminal connected to the power terminal, and a second terminal connected to the first terminal of the first input transistor N1 and the first terminal of the fourth input transistor N4. The second clock-controlled transistor P2 is provided with a control terminal for receiving the clock signal CLK, a first terminal connected to the power terminal, and a second terminal connected to the first terminal of the second input transistor N2 and the first terminal of the fifth input transistor N5.

In one embodiment, if the first clock-controlled transistor P1 and the second clock-controlled transistor P2 are P-type transistors, the P-type transistors are provided with sources as first terminals and gates as control terminals.

Before the pulse in the clock signal CLK arrives, if signals received at the control terminal of the first clock-controlled transistor P1 and the control terminal of the second clock-controlled transistor P2 are at a low level, the first clock-controlled transistor P1 and the second clock-controlled transistor P2 are turned on, the first clock-controlled transistor P1 pulls the drain voltage of the first input transistor N1 and the drain voltage of the fourth input transistor N4 to a voltage at the power terminal, and the second clock-controlled transistor P2 pulls the drain voltage of the second input transistor N2 and the drain voltage of the fifth input transistor N5 to the voltage at the power terminal.

In the foregoing technical solution, the two AND gate circuits generate, according to the control signal and the clock signal CLK, signals for controlling the operating modes of the two sampling units. Moreover, if the influence tendency of the signal to be compared DQ is decreasing, the first sampling unit 1011 is controlled to operate in the sampling mode; and if the influence tendency of the signal to be compared DQ is increasing, the second sampling unit 1021 is controlled to operate in the sampling mode. This ensures that the polarity of the differential signal generated before the signal to be compared DQ is influenced is the same as that of the differential signal generated after the signal to be compared DQ is influenced, so that the output circuit 103 can accurately output the comparison result according to the differential signals, thereby eliminating intersymbol interference.

Figure 3:
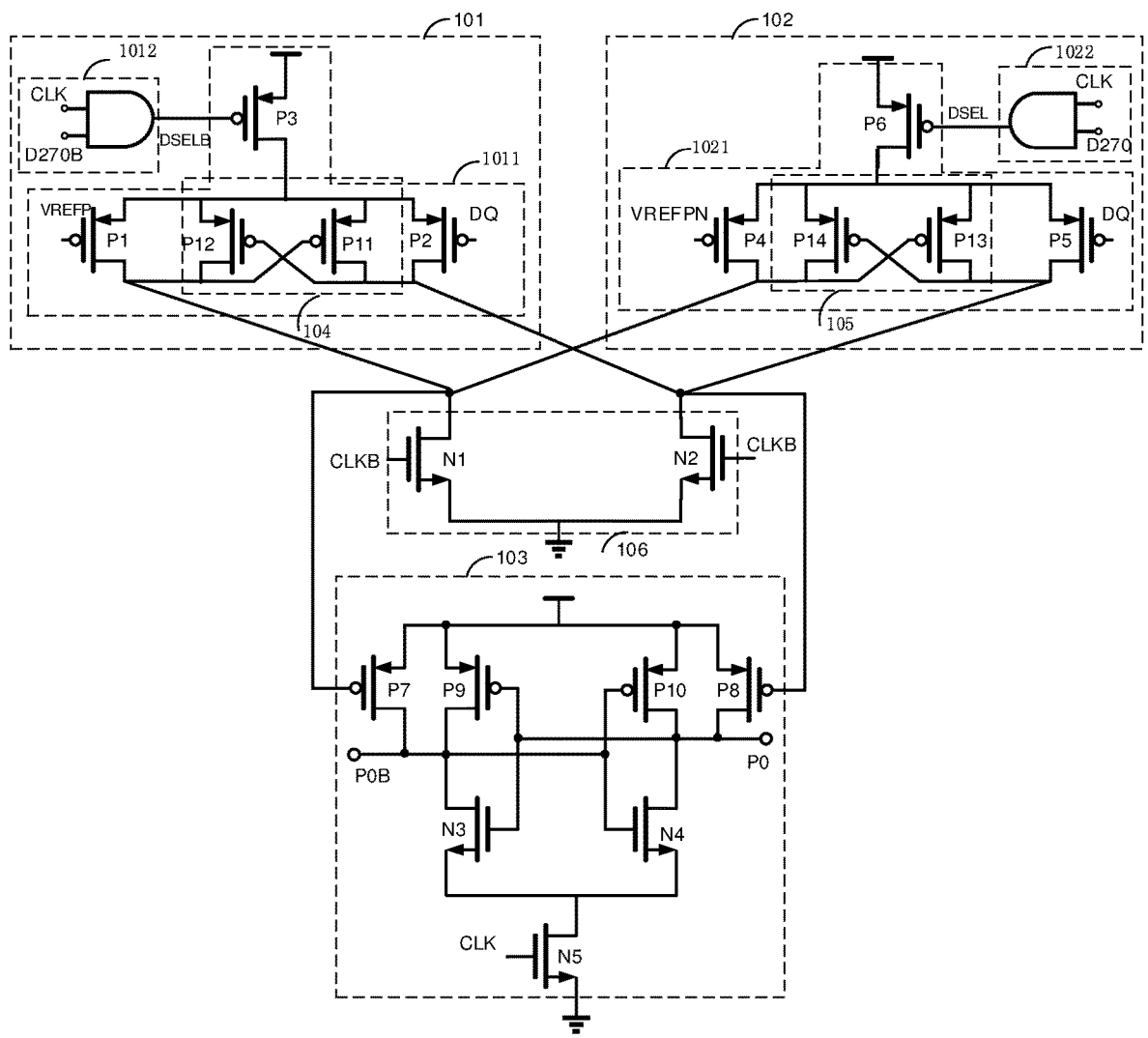
FIG. 3 is a specific circuit diagram of a comparator according to one embodiment of the present disclosure.

As shown in FIG. 3, one embodiment of the present disclosure provides a comparator, including a first sampling circuit 101, a second sampling circuit 102, an output circuit 103, a first positive feedback circuit 104, and a second positive feedback circuit 105. The first sampling circuit 101 is also provided with a first sampling unit 1011 and a first control unit 1012, and the second sampling circuit 102 is also provided with a second sampling unit 1021 and a second control unit 1022. The first positive feedback circuit 104 includes a first feedback unit 1041 and a second feedback unit 1042. The second positive feedback circuit 105 includes a third feedback unit 1051 and a fourth feedback unit 1052.

The first sampling unit 1011 includes a first input transistor P1, a second input transistor P2, and a third input transistor P3. A connection relationship of the transistors in the first sampling unit 1011 is the same as that shown in FIG. 2. Details are not described herein again. The second sampling unit 1021 includes a fourth input transistor P4, a fifth input transistor P5, and a sixth input transistor P6. The connection relationship of the transistors in the second sampling unit 1021 is the same as that shown in FIG. 2. Details are not described herein again. The first feedback unit 1041 includes a first feedback transistor P11, the second feedback unit includes a second feedback transistor P12, the third feedback unit 1051 includes a third feedback transistor P13, and the fourth feedback unit 1052 includes a fourth feedback transistor P14. The connection relationship of the transistors in the first feedback unit 1041 to the fourth feedback unit 1052 is the same as that shown in FIG. 2. Details are not described herein again. The output circuit 103 includes a first output transistor P7, a second output transistor P8, a third output transistor P9, a fourth output transistor P10, a fifth output transistor N3, a sixth output transistor N4, and a seventh output transistor N5. The connection relationship of the transistors in the output circuit 103 is the same as that shown in FIG. 2. Details are not described herein again.

It should be noted that if the first input transistor P1 to the sixth input transistor P6 are all P-type transistors, the P-type transistors are provided with drains as first terminals and gates as control terminals. The first output transistor P7 to the fourth output transistor P10 are all P-type transistors, and the fifth output transistor N3 to the seventh output transistor N5 are all N-type transistors, where the P-type transistors are provided with drains as first terminals and gates as control terminals, and the N-type transistors are provided with sources as first terminals and gates as control terminals.

It should also be noted that a second terminal of the third input transistor P3 and a second terminal of the sixth input transistor N6 are connected to a power terminal, and a first terminal of the seventh output transistor N5 is connected to a ground terminal.

A working principle of the first control unit 1012 and a working principle of the second control unit 1022 are described below:

When the signal to be compared DQ is influenced and the voltage value thereof becomes larger, the first control signal D270B is at a low level, and the second control signal D270 is at a high level. When the clock signal CLK arrives, the first AND gate circuit outputs the low level, the third input transistor P3 is turned on, the second AND gate circuit outputs the high level, and the sixth input transistor P6 is turned off. The first sampling unit 1011 operates in the sampling mode, the first feedback unit 1041 and the second feedback unit 1042 are configured to accelerate generation of first differential signals, and the second sampling unit 1021 operates in the idle mode.

When the signal to be compared DQ is influenced and the voltage value thereof becomes smaller, the first control signal D270B is at a high level, and the second control signal D270 is at a low level. When the clock signal CLK arrives, the first AND gate circuit outputs the high level, the third input transistor P3 is turned off, the second AND gate circuit outputs the low level, and the sixth input transistor P6 is turned on. The first sampling unit 1011 operates in the sampling mode, the second sampling unit 1021 operates in an idle mode, the third feedback unit 1051 and the fourth feedback unit 1052 are configured to accelerate generation of second differential signals.

In one embodiment, the comparator further includes a reset circuit 106 including a first clock-controlled transistor N1 and a second clock-controlled transistor N2. The connection mode of the transistors in the reset circuit 106 is the same as that shown in FIG. 2. Details are not described herein again. If the first clock-controlled transistor N1 and the second clock-controlled transistor N2 are N-type transistors, the N-type transistors are provided with sources as first terminals and gates as control terminals. It should also be noted that a first terminal of the first clock-controlled transistor N1 and a first terminal of the second clock-controlled transistor N2 are connected to a ground terminal.

Before the pulse in the clock signal arrives, the inverted clock signal CLKB is inputted to the first clock-controlled transistor N1 and the second clock-controlled transistor N2, so that the first terminal of the first input transistor P1, the first terminal of the second input transistor P2, the first terminal of the fourth input transistor P4, and the first terminal of the fifth input transistor P5 are pulled to a low level to reset the first sampling circuit 101 and the second sampling circuit 102.

Figure 4:
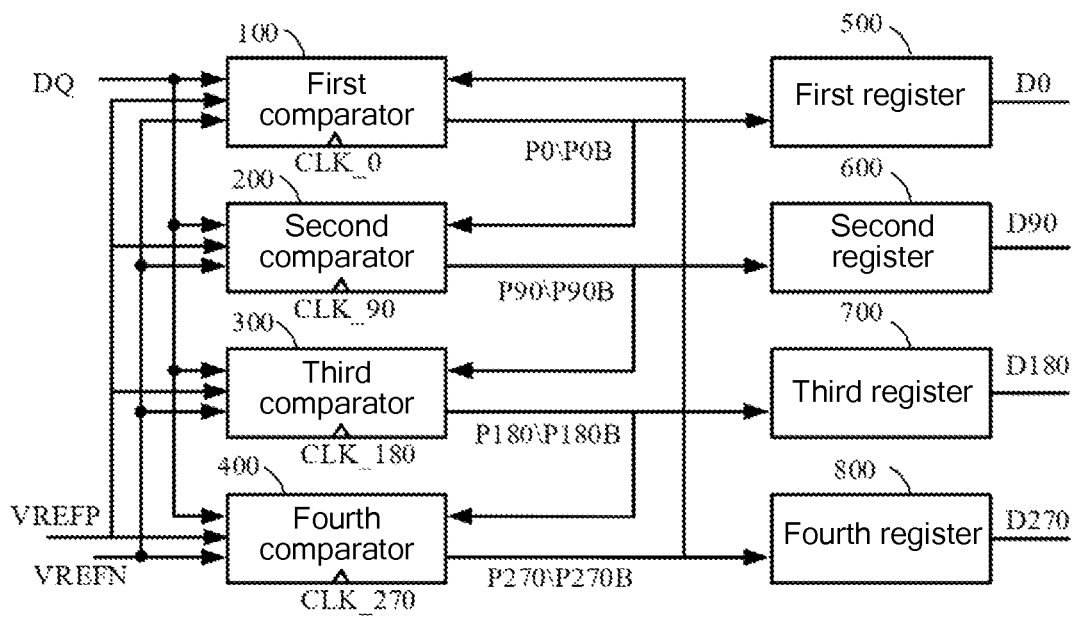
FIG. 4 is a structural block diagram of a decision feedback equalization circuit according to one embodiment of the present disclosure.

As shown in FIG. 4, one embodiment of the present disclosure provides a decision feedback equalization circuit, including four comparators. Each comparator is provided with six input terminals and two output terminals. The four comparators are sequentially marked as a first comparator 100, a second comparator 200, a third comparator 300, and a fourth comparator 400.

The first comparator 100 is provided with a first input terminal for receiving a signal to be compared DQ, a second input terminal for receiving a first reference signal VREFP, a third input terminal for receiving a second reference signal VREFN, a fourth input terminal and a fifth input terminal that are connected to an output terminal of the fourth comparator 400 for receiving a first control signal and a second control signal, and a sixth input terminal for receiving a first clock signal CLK_0.

The second comparator 200 is provided with a first input terminal for receiving the signal to be compared DQ, a second input terminal for receiving the first reference signal VREFP, a third input terminal for receiving the second reference signal VREFN, a fourth input terminal and a fifth input terminal that are connected to an output terminal of the first comparator 100 for receiving the first control signal and the second control signal, and a sixth input terminal for receiving a second clock signal CLK_90.

The third comparator 300 is provided with a first input terminal for receiving the signal to be compared DQ, a second input terminal for receiving the first reference signal VREFP, a third input terminal for receiving the second reference signal VREFN, a fourth input terminal and a fifth input terminal that are connected to an output terminal of the second comparator 200 for receiving the first control signal and the second control signal, and a sixth input terminal for receiving a third clock signal CLK_180.

The fourth comparator 400 is provided with a first input terminal for receiving the signal to be compared DQ, a second input terminal for receiving the first reference signal VREFP, a third input terminal for receiving the second reference signal VREFN, a fourth input terminal and a fifth input terminal that are connected to an output terminal of the third comparator 300 for receiving the first control signal and the second control signal, and a sixth input terminal for receiving a fourth clock signal CLK_D270.

In one embodiment, when the structure of the comparator in the decision equalization circuit is as shown in FIG. 2, the first comparator 100 is provided with the fifth input terminal connected to a second output terminal of the fourth comparator 400 and the sixth input terminal connected to a first output terminal of the fourth comparator 400.

In one embodiment, when the structure of the comparator in the decision equalization circuit is as shown in FIG. 3, the first comparator 100 is provided with the fifth input terminal connected to the first output terminal of the fourth comparator 400 and the sixth input terminal connected to the second output terminal of the fourth comparator 400.

A working principle of the decision feedback equalization circuit is described as follows: when an output signal P270B of the first output terminal of the fourth comparator 400 is at a low level, an output signal P270 of the second output terminal is at a high level. That is, when a result of the comparator is indicated by number "1", the signal to be compared DQ received by the fourth comparator 400 is relatively large. In this case, an influence tendency of the signal to be compared DQ received by the first comparator 100 is to make the signal to be compared DQ become larger, and the first comparator 100 generates first differential signals according to the signal to be compared DQ and the first reference signal VREFP having a relatively large value and generates a comparison result according to the first differential signals.

When the output signal P270B of the first output terminal of the fourth comparator 400 is at a high level, the output signal P270 of the second output terminal is at a low level. That is, when the result of the comparator is indicated by number "0", the signal to be compared DQ received by the fourth comparator 400 is relatively small. In this case, the influence tendency of the signal to be compared DQ received by the first comparator 100 is to make the signal to be compared DQ become smaller, and the first comparator 100 generates second differential signals according to the signal to be compared DQ and the second reference signal VREFN having a relatively small value and generates the comparison result according to the second differential signals.

The working principle of the second comparator 200 to the fourth comparator 400 is the same as that of the first comparator 100. Details are not described herein again.

In one embodiment, a phase of the first clock signal CLK_0 is 90° earlier than that of the second clock signal CLK_90, 180° earlier than that of the third clock signal CLK_180, and 270° earlier than that of the fourth clock signal CLK_D270.

In one embodiment, voltage transition times of the output terminals of the first comparator 100 to the fourth comparator 400 are all less than a time interval between the first clock signal CLK_0 and the second clock signal CLK_90. When a transition time of an output voltage of the fourth comparator 400 is less than 1U1 (the time interval between the first clock signal CLK_0 and the second clock signal CLK_90), it can be ensured that when the clock signal of the first comparator 100 arrives, the fourth comparator 400 steadily outputs and maintains the comparison result. In this way, the first comparator 100 can eliminate intersymbol interference according to the comparison result of the fourth comparator 400.

In one embodiment, the decision feedback equalization circuit further includes a first register 500, a second register 600, a third register 700, and a fourth register 800. The first register 500 is provided with an input terminal connected to the output terminal of the first comparator 100, and is configured to store the comparison result generated by the first comparator 100. The second register 600 is provided with an input terminal connected to the output terminal of the second comparator 200, and is configured to store the comparison result generated by the second comparator 200. The third register 700 is provided with an input terminal connected to the output terminal of the third comparator 300, and is configured to store the comparison result generated by the third comparator 300. The fourth register 800 is provided with an input terminal connected to the output terminal of the fourth comparator 400.

Figure 5:
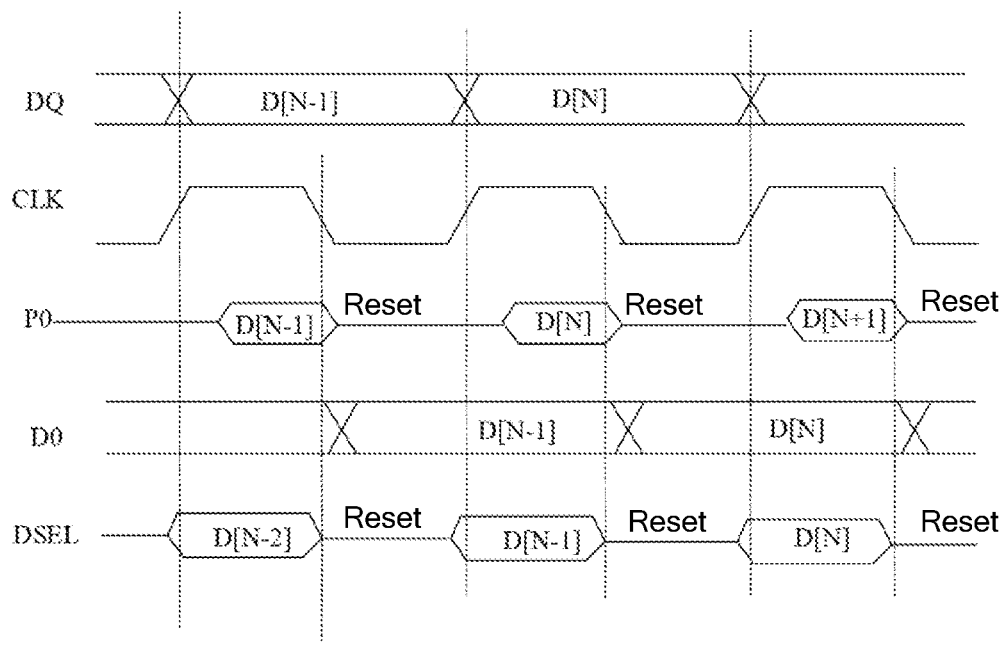
FIG. 5 is a sequence diagram of a decision feedback equalization circuit according to one embodiment of the present disclosure.

As shown in FIG. 5, the first comparator 100 is taken as an example to illustrate signal timing. When the clock signal arrives, the signal to be compared DQ and the output signals of two AND gate circuits also arrive, and are processed by the first comparator 100 and then outputted; the comparison result is outputted by the output terminal of the comparator; and the data is stored by the first register 500.

In the foregoing technical solution, by cascading the four comparators with each other, that is, connecting the output terminal of the previous comparator to the input terminal of the current comparator, an output result of the previous comparator controls a sampling circuit operating in the current comparator to eliminate the influence on the current signal to be compared DQ by the previous signal to be compared DQ, thereby improving the accuracy of the comparison results of the comparators; and then after the four register store the comparison results, data D0, data D90, data D180, and data D270 are outputted, so that multiple comparison results can be outputted continuously.

Those skilled in the art may easily figure out other embodiments of the present disclosure after considering the specification and practicing the application disclosed herein. The present disclosure is intended to cover any variations, purposes or applicable changes of the present disclosure. Such variations, purposes or applicable changes follow the general principle of the present disclosure and include common knowledge or conventional technical means in the technical field which is not disclosed in the present disclosure. The specification and embodiments are merely considered as illustrative, and the real scope and spirit of the present disclosure are pointed out by the appended claims.

It should be noted that, the present disclosure is not limited to the precise structures described above and shown in the drawings, and can be modified and changed in many ways without departing from the scope of the present disclosure. The scope of the present disclosure is defined by the appended claims.

The invention claimed is:

1. A comparator, comprising:
   a first sampling circuit, provided with an output terminal, and configured to generate, under control of a first control signal and a clock signal, first differential signals according to a signal to be compared and a first reference signal;
   a first positive feedback circuit, connected to the output terminal of the first sampling circuit, and configured to accelerate a difference between the first differential signals;
   a second sampling circuit, provided with an output terminal connected to the output terminal of the first sampling circuit, and configured to generate, under control of a second control signal and the clock signal, second differential signals according to the signal to be compared and a second reference signal, wherein the first reference signal is larger than the second reference signal;
   a second positive feedback circuit, connected to the output terminal of the second sampling circuit, and configured to accelerate a difference between the second differential signals; and
   an output circuit, provided with an input terminal connected to the output terminal of the first sampling circuit, and configured to amplify and latch a voltage signal of the output terminal of the first sampling circuit or a voltage signal of the output terminal of the second sampling circuit and output a comparison result.

2. The comparator according to claim 1, wherein
   the first positive feedback circuit comprises:
   a first feedback unit, provided with a control terminal connected to a first output terminal of the first sampling circuit and a first terminal connected to a second output terminal of the first sampling circuit; and
   a second feedback unit, provided with a control terminal connected to the second output terminal of the first sampling circuit and a first terminal connected to the first output terminal of the first sampling circuit; and
   the second positive feedback circuit comprises:
   a third feedback unit, provided with a control terminal connected to a first output terminal of the second sampling circuit and a first terminal connected to a second output terminal of the second sampling circuit; and
   a fourth feedback unit, provided with a control terminal connected to the second output terminal of the second sampling circuit and a first terminal connected to the first output terminal of the second sampling circuit.

3. The comparator according to claim 2, wherein
   the first feedback unit comprises a first feedback transistor, provided with a control terminal as the control terminal of the first feedback unit and a first terminal as the first terminal of the first feedback unit;
   the second feedback unit comprises a second feedback transistor, provided with a control terminal as the control terminal of the second feedback unit and a first terminal as the first terminal of the second feedback unit;
   the third feedback unit comprises a third feedback transistor, provided with a control terminal as the control terminal of the third feedback unit and a first terminal as the first terminal of the third feedback unit; and
   the fourth feedback unit comprises a fourth feedback transistor, provided with a control terminal as the control terminal of the fourth feedback unit and a first terminal as the first terminal of the fourth feedback unit.

4. The comparator according to claim 3, wherein the first sampling circuit comprises:
   a first sampling unit, provided with a control terminal, and configured to generate, when operating in a sampling mode, the first differential signals according to the signal to be compared and the first reference signal; and
   a first control unit, provided with an output terminal connected to the control terminal of the first sampling unit, and configured to control an operating mode of the first sampling unit according to the first control signal and the clock signal, wherein the operating mode includes the sampling mode.

5. The comparator according to claim 4, wherein the first sampling unit comprises:
   a first input transistor, provided with a control terminal for receiving the first reference signal and a first terminal, as a first output terminal of the first sampling unit, connected to the first terminal of the second feedback transistor;
   a second input transistor, provided with a control terminal for receiving the signal to be compared and a first terminal, as a second output terminal of the first sampling unit, connected to the first terminal of the first feedback transistor; and
   a third input transistor, provided with a control terminal as a control terminal of the first sampling unit, a first terminal connected to a second terminal of the first input transistor, a second terminal of the second input transistor, a second terminal of the first feedback transistor, and a second terminal of the second feedback transistor, and a second terminal connected to a ground terminal or a power terminal.

6. The comparator according to claim 4, wherein the first control unit comprises:
a first AND gate circuit, provided with a first input terminal for receiving the first control signal, a second input terminal for receiving the clock signal, and an output terminal as the output terminal of the first control unit.

7. The comparator according to claim 3, wherein the second sampling circuit comprises:
a second sampling unit, provided with a control terminal, and configured to generate, when operating in a sampling mode, the second differential signals according to the signal to be compared and the second reference signal; and
a second control unit, provided with an output terminal connected to the control terminal of the second sampling unit, and configured to control an operating mode of the second sampling unit according to the second control signal and the clock signal, wherein the operating mode includes the sampling mode.

8. The comparator according to claim 7, wherein the second sampling unit comprises:
a fourth input transistor, provided with a control terminal for receiving the signal to be compared and a first terminal, as a first output terminal of the second sampling unit, connected to the first terminal of the fourth feedback transistor;
a fifth input transistor, provided with a control terminal for receiving the second reference signal and a first terminal, as a second output terminal of the second sampling unit, connected to the first terminal of the third feedback transistor; and
a sixth input transistor, provided with a control terminal as the control terminal of the second sampling unit, a first terminal connected to a second terminal of the fourth input transistor, a second terminal of the fifth input transistor, a second terminal of the third feedback transistor, and a second terminal of the fourth feedback transistor, and a second terminal connected to a ground terminal or a power terminal.

9. The comparator according to claim 7, wherein the second control unit comprises:
a second AND gate circuit, provided with a first input terminal for receiving the second control signal, a second input terminal for receiving the clock signal, and an output terminal as the output terminal of the second control unit.

10. The comparator according to claim 3, wherein the first feedback transistor to the fourth feedback transistor, a first input transistor to a third input transistor of the first sampling circuit, and a fourth input transistor to a sixth input transistor of the second sampling circuit are of a same type.

11. The comparator according to claim 10, wherein
when the first feedback transistor to the fourth feedback transistor, and the first input transistor to the sixth input transistor are all N-type transistors, the N-type transistors are provided with drains as the first terminals and gates as the control terminals; and
when the first feedback transistor to the fourth feedback transistor, and the first input transistor to the sixth input transistor are all P-type transistors, the P-type transistors are provided with drains as the first terminals and gates as the control terminals.

12. The comparator according to claim 1, wherein the output circuit comprises:
a first output transistor, provided with a control terminal as a first input terminal of the output circuit, a first terminal as a first output terminal of the output circuit, and a second terminal connected to a ground terminal or a power terminal;
a second output transistor, provided with a control terminal as a second input terminal of the output circuit, a first terminal as a second output terminal of the output circuit, and a second terminal connected to the ground terminal or the power terminal;
a third output transistor, provided with a first terminal connected to the first terminal of the first output transistor, and a second terminal connected to the second terminal of the first output transistor;
a fourth output transistor, provided with a first terminal connected to the first terminal of the second output transistor, and a second terminal connected to the second terminal of the second output transistor;
a fifth output transistor, provided with a second terminal connected to the first terminal of the third output transistor, and a control terminal connected to a control terminal of the third output transistor and the first terminal of the fourth output transistor;
a sixth output transistor, provided with a second terminal connected to the first terminal of the fourth output transistor, and a control terminal connected to a control terminal of the fourth output transistor and the first terminal of the third output transistor; and
a seventh output transistor, provided with a control terminal for receiving the clock signal, a first terminal connected to the power terminal or the ground terminal, and a second terminal connected to the first terminal of the fifth output transistor and the first terminal of the sixth output transistor.

13. The comparator according to claim 12, wherein
the first output transistor to the fourth output transistor are all N-type transistors, and the fifth output transistor to the seventh output transistor are all P-type transistors, wherein the N-type transistors are provided with drains as the first terminals and gates as the control terminals, and the P-type transistors are provided with sources as the first terminals and gates as the control terminals; or,
the first output transistor to the fourth output transistor are all P-type transistors, and the fifth output transistor to the seventh output transistor are all N-type transistors, wherein the P-type transistors are provided with drains as the first terminals and gates as the control terminals, and the N-type transistors are provided with sources as the first terminals and gates as the control terminals.

14. The comparator according to claim 1, further comprising:
a reset circuit, connected to the first sampling circuit and the second sampling circuit, and configured to reset a voltage of the first sampling circuit and a voltage of the second sampling circuit.

15. The comparator according to claim 14, wherein the reset circuit comprises:
a first clock-controlled transistor, provided with a control terminal for receiving the clock signal, a first terminal connected to a power terminal or a ground terminal, and a second terminal connected to a first terminal of a first input transistor and a first terminal of a fourth input transistor; and
a second clock-controlled transistor, provided with a control terminal for receiving the clock signal, a first terminal connected to the power terminal or the ground terminal, and a second terminal connected to a first terminal of a second input transistor and a first terminal of a fifth input transistor.

16. A decision feedback equalization circuit, comprising four of the same comparators according to claim 1 sequentially marked as a first comparator, a second comparator, a third comparator, and a fourth comparator, wherein the first comparator is provided with a first input terminal for receiving the signal to be compared, a second input terminal for receiving the first reference signal, a third input terminal for receiving the second reference signal, a fourth input terminal and a fifth input terminal that are connected to an output terminal of the fourth comparator for receiving the first control signal and the second control signal, and a sixth input terminal for receiving a first clock signal;

the second comparator is provided with a first input terminal for receiving the signal to be compared, a second input terminal for receiving the first reference signal, a third input terminal for receiving the second reference signal, a fourth input terminal and a fifth input terminal that are connected to an output terminal of the first comparator for receiving the first control signal and the second control signal, and a sixth input terminal for receiving a second clock signal;

the third comparator is provided with a first input terminal for receiving the signal to be compared, a second input terminal for receiving the first reference signal, a third input terminal for receiving the second reference signal, a fourth input terminal and a fifth input terminal that are connected to an output terminal of the second comparator for receiving the first control signal and the second control signal, and a sixth input terminal for receiving a third clock signal; and the fourth comparator is provided with a first input terminal for receiving the signal to be compared, a second input terminal for receiving the first reference signal, a third input terminal for receiving the second reference signal, a fourth input terminal and a fifth input terminal that are connected to an output terminal of the third comparator for receiving the first control signal and the second control signal, and a sixth input terminal for receiving a fourth clock signal.

17. The decision feedback equalization circuit according to claim 16, wherein a phase of the first clock signal is 90° earlier than a phase of the second clock signal, 180° earlier than a phase of the third clock signal, and 270° earlier than a phase of the fourth clock signal.

18. The decision feedback equalization circuit according to claim 16, wherein voltage transition times of the output terminals of the first to fourth comparators are all less than a time interval between the first clock signal and the second clock signal.

19. The decision feedback equalization circuit according to claim 16, further comprising:

a first register, provided with an input terminal connected to the output terminal of the first comparator;

a second register, provided with an input terminal connected to the output terminal of the second comparator;

a third register, provided with an input terminal connected to the output terminal of the third comparator; and a fourth register, provided with an input terminal connected to an output terminal of the fourth comparator.

* * * * *